United States Patent
Park

(10) Patent No.: US 10,740,188 B2
(45) Date of Patent: Aug. 11, 2020

(54) VOLATILE MEMORY DEVICE AND METHOD FOR EFFICIENT BULK DATA MOVEMENT, BACKUP OPERATION IN THE VOLATILE MEMORY DEVICE

(71) Applicant: Winbond Electronics Corp., Taichung (TW)

(72) Inventor: San-Ha Park, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/212,706

(22) Filed: Dec. 7, 2018

(65) Prior Publication Data

US 2020/0183791 A1    Jun. 11, 2020

(51) Int. Cl.
*G11C 8/18* (2006.01)
*G06F 11/14* (2006.01)
(Continued)

(52) U.S. Cl.
CPC ...... *G06F 11/1451* (2013.01); *G06F 11/1456* (2013.01); *G11C 7/06* (2013.01);
(Continued)

(58) Field of Classification Search
CPC ................................. G11C 7/10; G11C 8/16
(Continued)

(56) References Cited

U.S. PATENT DOCUMENTS 4,819,209 A    4/1989  Takemae et al.
5,325,325 A *  6/1994  Azuma .............. G11C 11/419
                                                365/149

(Continued)

FOREIGN PATENT DOCUMENTS

CN    102169717    8/2011
JP    S63898       1/1988
(Continued)

OTHER PUBLICATIONS

Xiaowei Jiang et al., "Architecture Support for Improving Bulk Memory Copying and Initialization Performance", 2009 18th International Conference on Parallel Architectures and Compilation Techniques, Sep. 2009, pp. 1-12.

(Continued)

*Primary Examiner* — Michael T Tran
(74) *Attorney, Agent, or Firm* — JCIPRNET

(57) ABSTRACT

A volatile memory and a method for efficient bulk data movement, backup operation in the volatile memory device are provided. The volatile memory device includes: a plurality of subarray, configured to access data, wherein each of the subarray is electrically coupled to each other. The row address control, configured to control the row of each of the plurality of subarray. The column control, configured to control the column of each of the plurality of subarray. The plurality of sense amplifier, adapted to each of the plurality of sub array is periodically enabled during the data access operation. The plurality of sub word driver, adapted on the adjacent to the plurality of sub array provides a driving signal to the corresponding word line in the plurality of subarray. The volatile memory device performs a data movement operation in a predetermined block and determine an odd data and an even data in the predetermined block. The volatile memory device enables a first backup block and a second backup block in a dynamic memory array through the row address control and backup the odd data and the even data simultaneously into the first backup block and the second backup block.

13 Claims, 6 Drawing Sheets

(51) Int. Cl.
  *G11C 7/06* (2006.01)
  *G11C 11/418* (2006.01)
  *G11C 11/406* (2006.01)

(52) U.S. Cl.
  CPC .......... *G11C 8/18* (2013.01); *G11C 11/40615* (2013.01); *G11C 11/418* (2013.01)

(58) Field of Classification Search
  USPC ........................................ 365/189.17, 230.05
  See application file for complete search history.

(56) References Cited

U.S. PATENT DOCUMENTS

| | | | | |
|---|---|---|---|---|
| 5,495,443 | A * | 2/1996 | Koike | G11C 11/4096 |
| | | | | 365/189.09 |
| 5,640,351 | A * | 6/1997 | Yabe | G11C 7/10 |
| | | | | 365/189.04 |
| 5,703,810 | A * | 12/1997 | Nagy | G11C 7/1006 |
| | | | | 365/189.05 |
| 5,835,436 | A * | 11/1998 | Ooishi | G11C 7/10 |
| | | | | 365/230.03 |
| 7,551,485 | B2 * | 6/2009 | Honma | G11C 11/5642 |
| | | | | 365/185.12 |
| 9,747,170 | B2 | 8/2017 | Lee | |
| 9,875,799 | B1 * | 1/2018 | De Santis | G11C 15/046 |
| 9,922,695 | B2 | 3/2018 | Tomishima et al. | |
| 2003/0202399 | A1 | 10/2003 | Nguyen et al. | |
| 2008/0037356 | A1 | 2/2008 | Kajigaya | |
| 2008/0112251 | A1 * | 5/2008 | Youn | G11C 5/025 |
| | | | | 365/230.03 |
| 2009/0198881 | A1 * | 8/2009 | Toda | G06F 11/1048 |
| | | | | 711/108 |
| 2011/0205776 | A1 * | 8/2011 | Murata | G11C 7/1012 |
| | | | | 365/72 |
| 2012/0081959 | A1 * | 4/2012 | Lee | G11C 11/5642 |
| | | | | 365/185.09 |
| 2012/0159277 | A1 * | 6/2012 | Hoei | G11C 16/3459 |
| | | | | 714/746 |
| 2012/0250424 | A1 * | 10/2012 | Yoshihara | G11C 7/1006 |
| | | | | 365/189.05 |
| 2013/0117636 | A1 * | 5/2013 | Kim | G11C 29/848 |
| | | | | 714/773 |
| 2013/0227344 | A1 * | 8/2013 | Sohn | G06F 11/27 |
| | | | | 714/6.21 |
| 2016/0005453 | A1 * | 1/2016 | Seo | G11C 11/4093 |
| | | | | 365/189.02 |
| 2017/0110206 | A1 * | 4/2017 | Ryu | G11C 29/44 |
| 2017/0329540 | A1 | 11/2017 | Kim | |
| 2017/0365348 | A1 * | 12/2017 | Kamata | G11C 16/26 |
| 2018/0012664 | A1 * | 1/2018 | Kwon | G11C 16/08 |
| 2018/0075902 | A1 * | 3/2018 | Shirakawa | G06F 11/1068 |
| 2018/0122450 | A1 * | 5/2018 | Berger | G11C 11/1675 |
| 2018/0137920 | A1 * | 5/2018 | Song | G11C 16/0483 |
| 2018/0277180 | A1 * | 9/2018 | Yoshida | G11C 8/16 |
| 2018/0321871 | A1 | 11/2018 | Willcock et al. | |
| 2018/0357007 | A1 * | 12/2018 | Zawodny | G11C 7/1006 |
| 2018/0364908 | A1 * | 12/2018 | Lea | G06F 3/061 |
| 2019/0066743 | A1 * | 2/2019 | Dodge | G11C 13/0028 |
| 2020/0066333 | A1 * | 2/2020 | Fujiwara | G11C 11/418 |
| 2020/0144268 | A1 * | 5/2020 | Singh | H01L 21/76895 |

FOREIGN PATENT DOCUMENTS

| | | |
|---|---|---|
| JP | H05242678 | 9/1993 |
| JP | H0969287 | 3/1997 |
| JP | H11120762 | 4/1999 |
| JP | 2008041220 | 2/2008 |
| TW | 1341977 | 5/2011 |

OTHER PUBLICATIONS

Shih-Lien Lu et al., "Improving DRAM latency with dynamic asymmetric subarray", 2015 48th Annual IEEE/ACM International Symposium on Microarchitecture (MICRO), Dec. 2015, pp. 255-266.

Vivek Seshadri et al., "RowClone: Fast and Energy-Efficient In-DRAM Bulk Data Copy and Initialization", 2013 46th Annual IEEE/ACM International Symposium on Microarchitecture (MICRO), Dec. 2013, pp. 1-13.

Li Zhao et al., "Hardware support for bulk data movement in server platforms", 2005 International Conference on Computer Design, Oct. 2005, pp. 1-8.

"Office Action of Taiwan Counterpart Application", dated Oct. 3, 2019, pp. 1-7.

* cited by examiner

VOLATILE MEMORY DEVICE AND METHOD FOR EFFICIENT BULK DATA MOVEMENT, BACKUP OPERATION IN THE VOLATILE MEMORY DEVICE

BACKGROUND OF THE INVENTION

Technical Field

The present disclosure relates to a volatile memory device, and more relates to a volatile memory device and a method for efficient bulk data movement, backup operation in the volatile memory device.

Description of Related Art

Nowadays, in the field artificial intelligence AI, machine learning applications, the volatile memory device is widely used. For those applications, the mass (bulk) data need to transfer between the volatile memory device in the pin-limited channel, especially for accelerator application case, efficient bulk data movement is very critical within the volatile memory device. To satisfy the market demand of bulk data movement in the volatile memory device, the design of volatile memory device with efficient bulk data movement is necessary and also perform data movement at high speed.

Several architectures have been proposed for the efficient bulk data movement with high speed. For example, row clone and low cost inter linked subarray (LISA), however the effectiveness is limited for row clone method which may enable fast data movement but the method is limited only when the data movement is within the same subarray of the one volatile memory device. To overcome the deficiency of limited data movement within the same subarray, interlinked subarray has been proposed by dividing memory cells into many subarrays and each subarray are connected through the wide bit line interface, rows in different sub arrays are connected with narrow 64-bit data bus within the volatile memory device. Those conventional techniques however perform the efficient bulk data movement but incurs the long latency and high-power consumption. In addition, there is unavailability of wide data path to connect the subarrays within the same memory cells. To overcome this issue, the additional circuits are necessary and the operating time is much higher, leads to slow down the data movement. In addition, by adopting the additional circuit the chip size also increased and the process difficulty.

Along with the efficient bulk data movement in the volatile memory, it could be desirable to actually develop a volatile memory device that has efficient bulk data movement with hidden backup operation, high speed, low cost and easy implementation with low power consumption for certain applications in this technical field.

SUMMARY OF THE INVENTION

The disclosure provides a volatile memory device and a method for efficient bulk data movement, backup operation in the volatile memory device. The volatile memory device having a plurality of subarray, configured to access data, each of the subarray is electrically coupled to each other. The row address control, configured to control the row of each of the plurality of subarray. The column control, configured to control the column of each of the plurality of subarray. The plurality of sense amplifier, adapted to each of the plurality of sub array is periodically enabled during the data access operation. The plurality of sub word driver, adapted on the adjacent to the plurality of sub array provides a driving signal to the corresponding word line in the plurality of subarray. The volatile memory device, configured to perform a data movement operation in a predetermined block and determine an odd data and an even data in the predetermined block. The volatile memory device enables a first backup block and a second backup block in a dynamic memory array through the row address control and backup the odd data and the even data simultaneously into the first backup block and the second backup block.

The volatile memory device determines the first backup block and the second backup block in the dynamic memory array through an active command.

The volatile memory device self-defines the first backup block and the second backup block in the dynamic memory array.

The volatile memory device performs a data movement operation in the predetermined block is determined by the active command. The volatile memory device performs a data movement operation in the predetermined block is determined by a self-refresh operation. The active command includes an address location of the predetermined block, the first backup block and the second backup block.

In an embodiment of the invention, during the self-refresh operation, determining the data movement operation with backup or without backup is selected by a model repository backup or a backup on-the-fly.

The method of efficient hidden data movement in a volatile memory device having a dynamic memory array, includes the steps of determining a backup array and a normal array in the volatile memory device by an active command. The normal operation and a backup operation is determined by the active command. The steps of performing the backup operation includes the steps of performing a data movement operation in a predetermined block, determining an odd data and an even data in the predetermined block, periodically enabling a sense amplifier of the predetermined block, subsequent to enabling sense amplifier, enabling a first backup block and a second backup block in the dynamic memory array through a row address control, and backup the odd data and the even data simultaneously into the first backup block and the second backup block.

In embodiments of the invention, this method may perform dedicated data movement in the volatile memory device. In addition to the data movement hidden backup is performed at the same time at different location by sub diving the data into odd data and even data into first data backup block and second data backup block. Thus, the wide data path is not needed to transfer the bulk data. Furthermore, by performing the hidden backup operation during the bulk data movement operation the power consumption is greatly reduced by sharing the backup operation with the refresh function.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
FIG. 1 illustrates a block diagram of memory bank in volatile memory device according to an exemplary embodiment of the disclosure.
Figure 1:
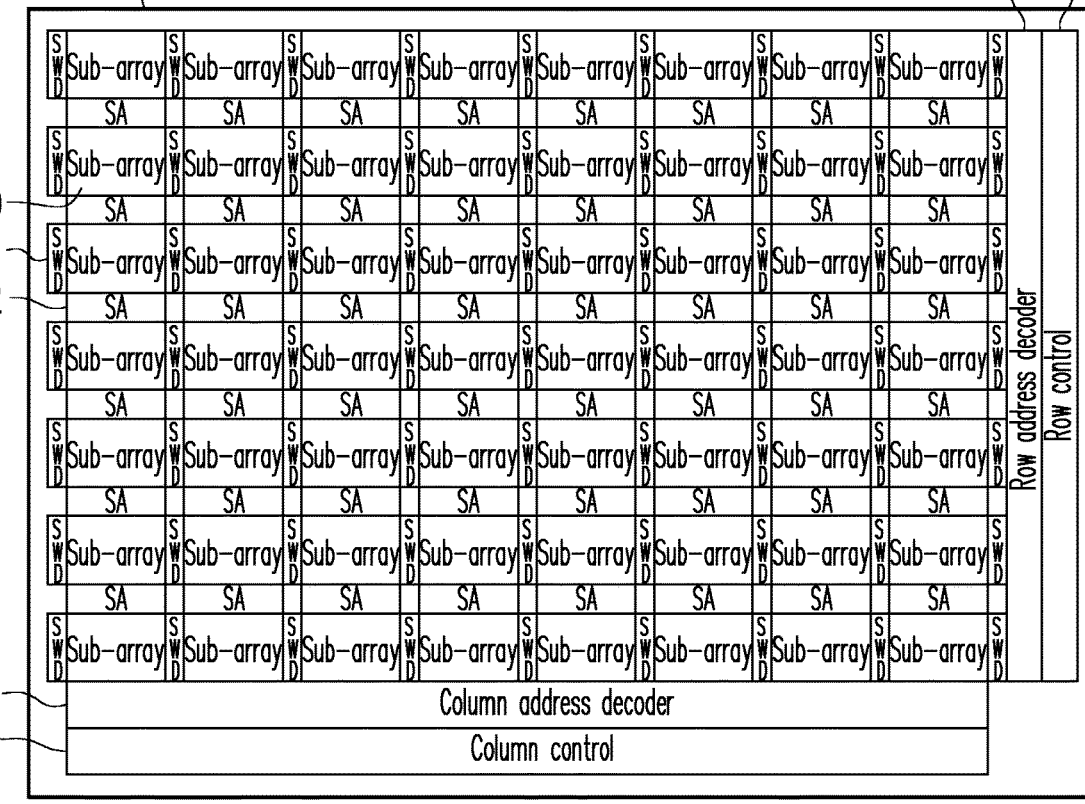

FIG. 1 illustrates a block diagram of memory bank in volatile memory device according to an exemplary embodiment of the disclosure. Referring to FIG. 1, a volatile memory device 100, includes a plurality of memory banks 110. Each of the plurality of memory banks 110 is divided into plurality of sub-arrays 150. The number of subarrays in the memory bank 110 is decided based on the density of the volatile memory device 100. The volatile memory device 100 may be any type of memory devices such as dynamic random-access memory (DRAM), static random-access memory (SRAM). The plurality of memory banks 110, which is also termed as "Bank", configured to store a data which are electrically connected to each other. For example, the volatile memory device 100 is divided into multiple memory cells, typically 8 to 64 banks. Each of the bank is further subdivided into plurality of subarrays 16×8 Kb, 64×8 Kb, 512×8 Kb, but the invention is not limited thereto. Each of the bank having a plurality of subarray 150, are coupled to the corresponding sub word driver SWD 151 and sense amplifier SA 152. The sub word drivers SWD 151 are provided corresponding sub word lines. The sub word driver 151 is arranged adjacent to both sides of the sub-array to drive the corresponding subarray 150. The plurality of sub arrays 150 which are internally connected by internal data bus, configured to perform the data movement between the memory cells.

The volatile memory device 100 further includes, a row address control 125, a row address decoder 120, a column control 135, a column address decoder 130. The row address control 125 and the column address control 135 receives the control signal from the address register to access the data in corresponding row data and column data. The access data in this specification refers to backup data without read/write operation. The data is access by the following command signals for example, "SELF-REFRESH", "BACKUP".

Hence the memory command signals in the invention is not limited to specific command operation. Based on the command from the address register to access the data, the row control 125 provide a control signal to the row address decoder. The row address decoder 120 selects one row of the memory bank 110. Similarly, the column address decoder 135 selects the column data corresponding to the column control signal from column control 130. The sense amplifier SA 152 are adapted to each of the plurality of subarray is periodically enable/disable during the data movement (backup) operations. The refresh counter, which is not detailed in the schematic, configured to performs refresh operation in the memory bank. Furthermore, the refresh counter also performs "self-refresh" or "auto refresh" the memory cells without any active command. Thus, the refresh counter in the invention is not limited thereto.

The volatile memory device 100, configured to perform the data movement (backup) operations in the memory cells upon the request from the user. During the data movement (backup) operations the volatile memory device performs the data movement operation in the defined memory block. In the exemplary embodiment of the invention, performing the data movement operations on the specified memory bank is determined as predetermined block, but the predetermined block may be one or more by enable the sense amplifier SA 152 and sub word driver SWD 151 to the corresponding sub-array 150, that need to perform the data movement operations and backup the data at the same time at different address location simultaneously, which is detailed below.

Figure 2:
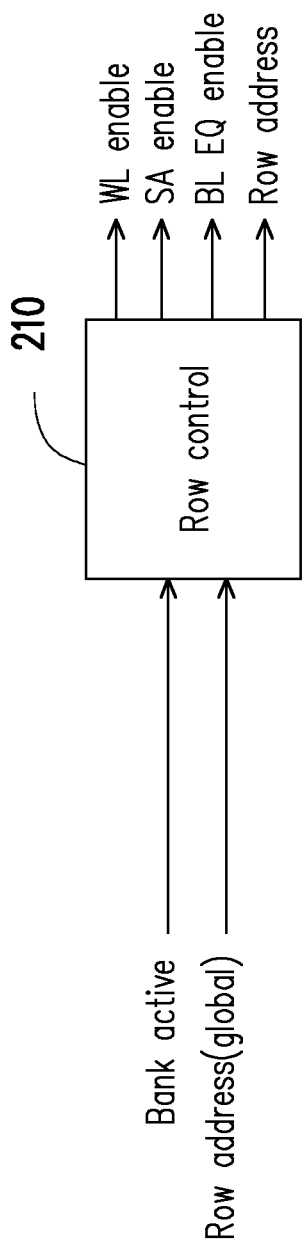
FIG. 2 illustrates a block diagram of a conventional row control of the volatile memory device.

FIG. 2 is illustrating a block diagram of a conventional row control in a volatile memory device. Referring to FIG. 2, the row control 210 is the row control 125 as detailed in FIG. 1, thus the detail description of the operation of row control is omitted herein. In the conventional volatile memory device, the row control receives the bank active signal and the row address signal from the address register to access the data. In response to the bank active signal and the row address signal, the row control 210 provides the enable signal to the word line WL, through the sub word driver SWD and the sense amplifier SA enable, and the bit line BL EQ enable and the row address to access data in corresponding sub arrays. In conventional methods, the access data refers to read/write operations. By this architecture, the data in the corresponding row may be accessed by the back active signal and row address signal from the address register of the volatile memory device. Since the conventional volatile memory device performs read/write operation in corresponding bank and have limitation on data movement operation in the volatile memory device by using wide data path between the sub arrays, incurs long latency and high memory consumption.

Figure 3:
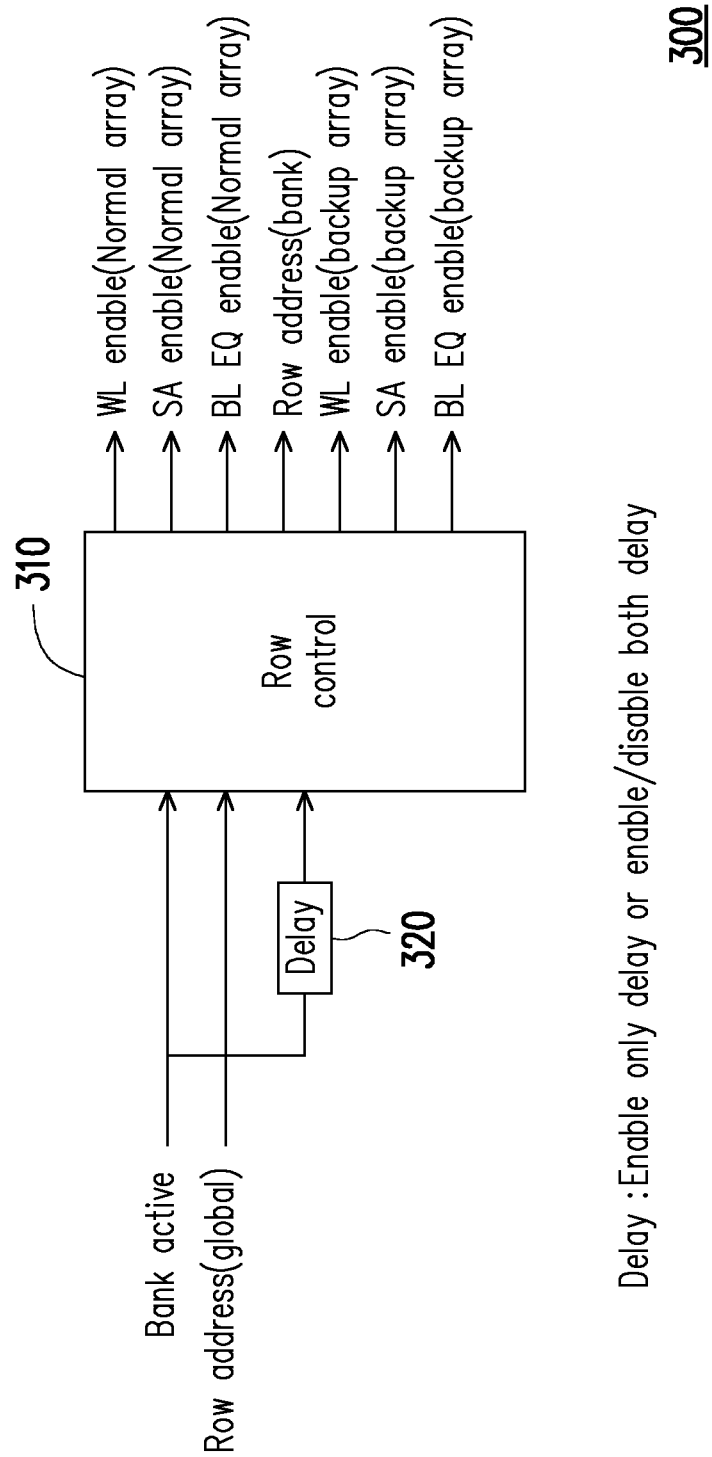
FIG. 3 illustrates a block diagram of row control of the volatile memory device according to an exemplary embodiment of the disclosure.

FIG. 3 illustrates a block diagram of row control of the volatile memory device according to an exemplary embodiment of the disclosure. Referring to FIG. 1, the row control 310 is the similar to the row control 125 as detailed in FIG. 1. Referring to convention row control 210 as detailed above, the row control 310 in exemplary embodiment of the disclosure receives ban active signal and the row address signal to perform the access data in the corresponding subarray. The access data in the exemplary embodiment refers to backup data without read/write operations. The subarray 150 of the memory bank 110 is determined to be normal array and the back array in the volatile memory device. Apart, from the normal operation as detailed in FIG. 2, the volatile memory device performs a data movement (hidden back up data) by an active command. In some other embodiments, the backup operation is performed without an active command, the controller in the DRAM itself define the backup operation, hence the start backup operation in the disclosure is not limited thereto. The operation sequence of the normal operation and the backup operation is detailed below. In addition to the back active signal and the row address signal to the row control, the delay signal corresponding to the back active is provided to the row control to perform the backup operation, the detail operation of the backup operation is detailed below.

During the backup operation, the row control 310, receives the bank active signal to enable the sub array to perform data movement operation and the row address signal to locate the row address of the sub array to perform the data movement operation. In addition to the bank active signal the row control 310 receives the enable signal with the delay which is generated by delay circuit 320. The delay circuit 320 having N number of inverter circuits, where N is chosen to be real positive number (for e.g., N=1, 2, 3, 4 . . . ). In some embodiments, the delay circuit 320 may be also implemented by using resistor and capacitor (RC delay) or the logic circuits. Hence the delay circuit 320 in this disclosure is not limited thereto. After receives the command from the address register to access the data, the row control 310 provide the enable signal to the normal array WL enable (normal array), SA enable (normal array), BL EQ (normal array) and the backup array WL enable (backup array), SA enable (backup array), BL enable (backup array) corresponding to the sub array row address (bank) to perform the normal operation and the backup operation at the same time, thereby the efficient data movement operation is achieved with less power consumption consumed, during the backup operation. The detail operation of subdividing the memory cells into normal array and the backup array is detailed below. By this method the power consumption and hidden backup during data movement operations is achieved without adding extra hardware for backup operation.

Figure 4:
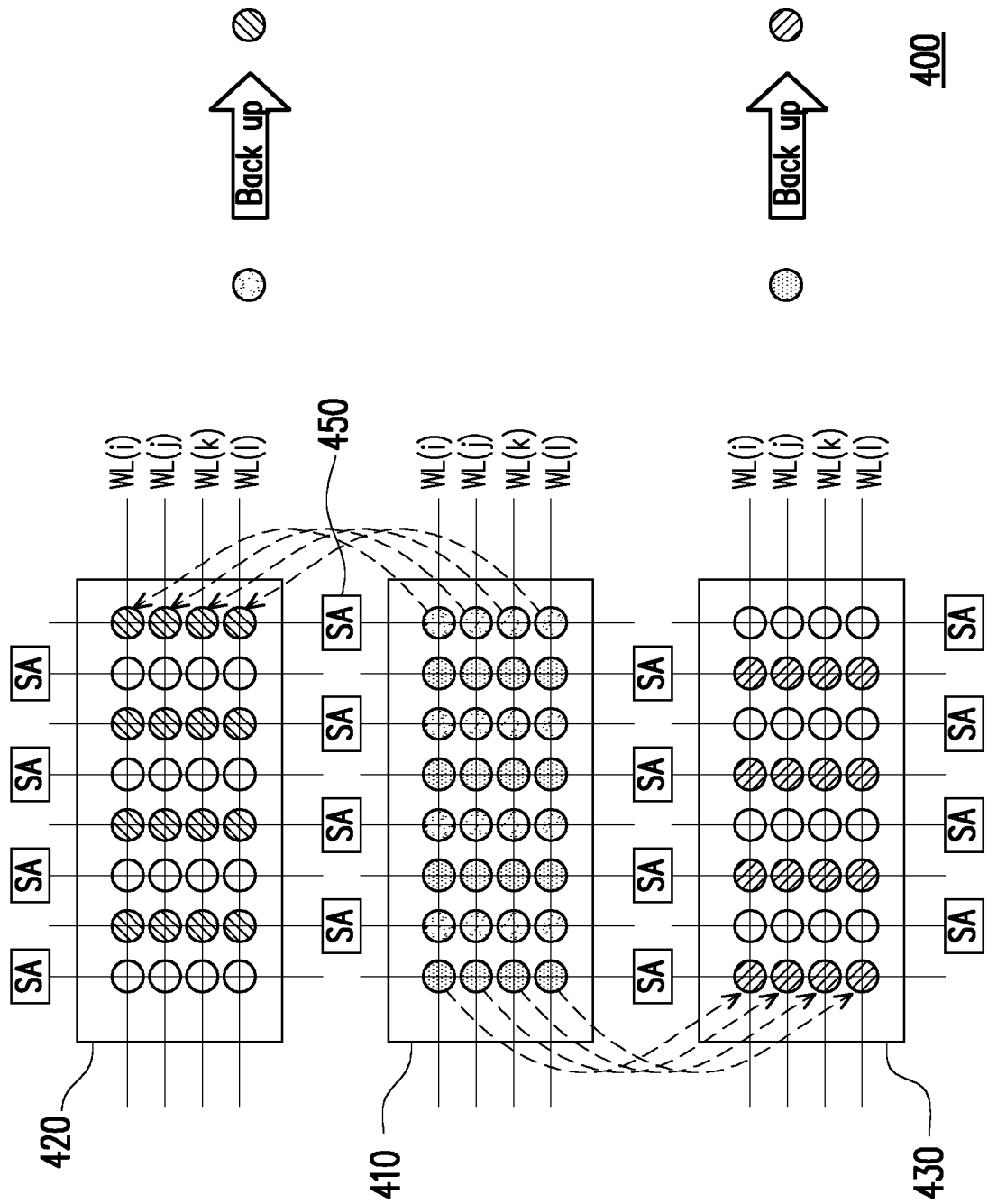
FIG. 4 illustrates a bulk data movement operation (backup operation) sequence of volatile memory device according to an exemplary embodiment of the disclosure.

FIG. 4 illustrates a bulk data movement operation sequence of volatile memory device according to an exemplary embodiment of the disclosure. Referring to FIG. 1 the schematic diagram memory bank of a volatile memory device 100 is similar. During the data movement (back up) operation, the volatile memory device 400 determines an odd data and even data in the predetermined block 410. The predetermined block 410, for an example in the exemplary embodiment is subdivided into 4 rows which are corresponding coupled to the word line WL, represented as WL(i), WL (j), WL (k), WL (l). Similarly, the data in each column are coupled to corresponding sense amplifier SA. When the data movement (backup) operation is enabled, the volatile memory device determines the odd data and even data in the predetermined block 410, where odd data is determined as the data in odd columns (for e.g., columns 1, 3, 5, 7 . . . ). Similarly, the even data is determined by the controller by selecting the data in even columns (for e.g., columns 2, 4, 6, 8 . . . ). In some other embodiments the volatile memory device controller 400 may determine the odd data and even data in the predetermined block 410, thus the determination of odd data and even data in the predetermined block 420 in the disclosure is not limited thereto.

After the determination of the odd data and the even data in the predetermination block 410, the controller enables the first backup block 420 and the second backup block 430, where the first backup block 420 and second backup block 430 are defined as the backup array during the data movement operation. The odd data in the predetermined block 410 is moved to first backup block 420 and the even data is moved to the second backup block 430 simultaneously.

Thus, the efficient data movement and hidden backup operation is performed in the volatile memory device by dividing the data need to be moved into different locations performed at the same time. By this operation no wide data path is necessary for the bulk data movement during the refresh operation, the power consumption is greatly reduced by sharing the backup operation with the refresh function.

In some embodiments the volatile memory defines the first backup block 420 and second backup block 430 in default and in some other embodiments the first backup block 420 and second data backup block 430 is defined by the controller through active command. In some embodiments the backup operation is performed during the self-refresh or the auto refresh operation. The active command provides by the volatile memory device controller having the address location of the predetermined block, the first backup block and the second backup block. During the self-refresh command, the data movement operation with backup and without backup is selected by the model repository backup (MRS) or the backup on-the-fly.

Figure 5:
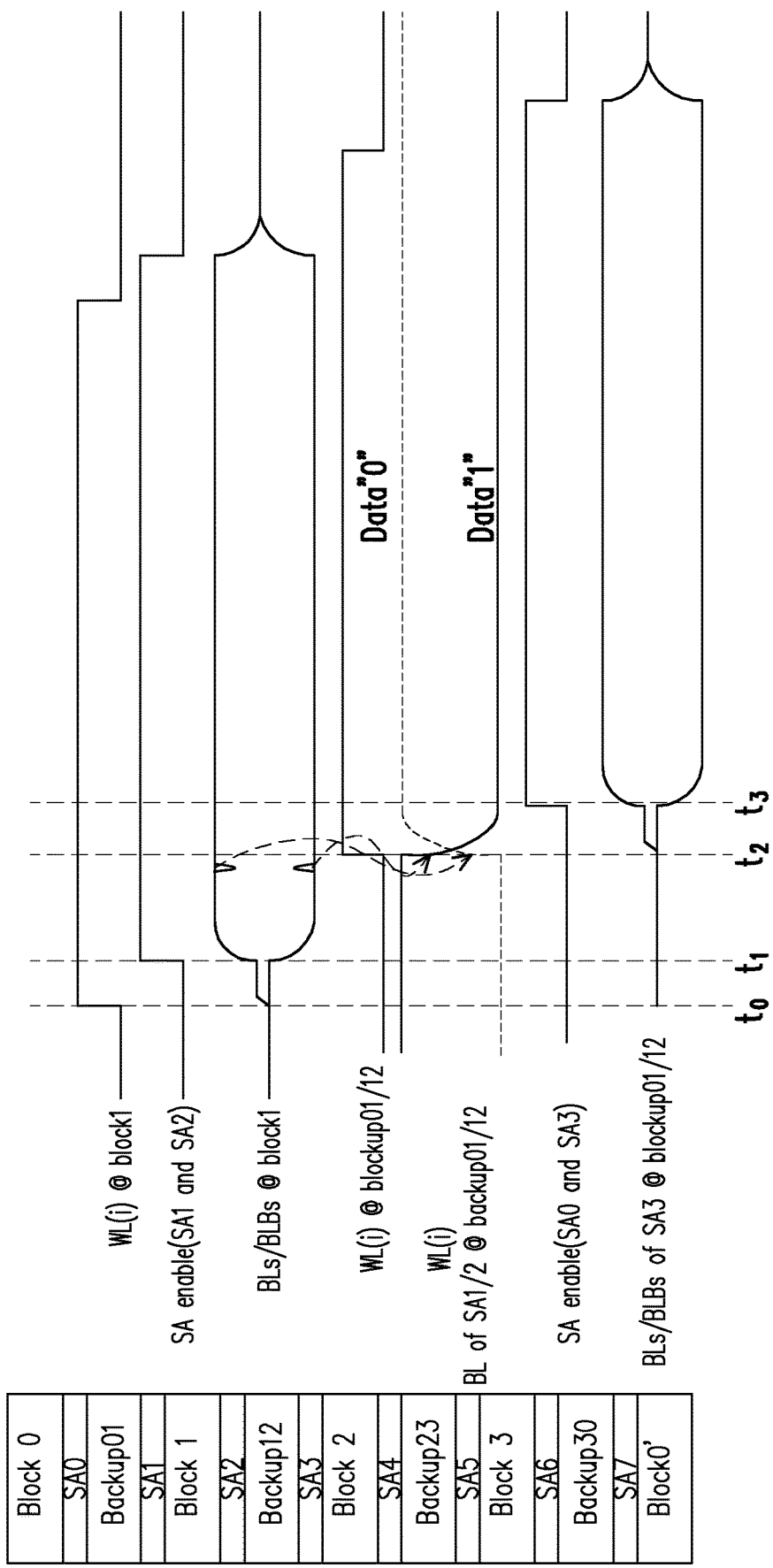
FIG. 5 illustrates an operation waveform of bulk data movement (backup operation) in volatile memory device according to an exemplary embodiment of the disclosure.

FIG. 5 illustrates an operation waveform of bulk data movement in volatile memory device according to an exemplary embodiment of the disclosure. Referring to FIG. 4, during the data movement operation, at time to the word line WL (i) of the predetermined block 1, to enable block 1. Subsequent to the WL(i) enable, the BL and complementary bitline BL # is enabled corresponding in the predetermined block 1. After the time delay $t_1$, the sense amplifier SA corresponding to the data in the predetermined block 1 is enabled. In the meantime, the volatile memory device determines the first backup block and second backup block to back up the odd data and even data. At time $t_2$, the cell nodes coupled to the correspond WL and BL are backup at the first backup block, block 01 and the second data backup block, block 12 simultaneously. Similarly, during time $t_3$, the SA lines of SA0 and SA3 are enabled, and the BL and BL # of corresponding data in predetermined block are enabled during the back up operation. The backup operation is performed at backup block 01 and backup block 12, during this operation first data backup block is backup 01 and the second data backup block is backup 12. Thus, the multiple predetermined blocks are enabled simultaneously by enable the corresponding SA and WL signals. Referring to FIG. 5, the normal array and the backup array is distinguished by the controller during by the active command Xadd<i>=0/1. For example, the active command for normal operation is defined as Xadd<i>=0, and the backup operation is defined as Xadd<i>=1.

Figure 6:
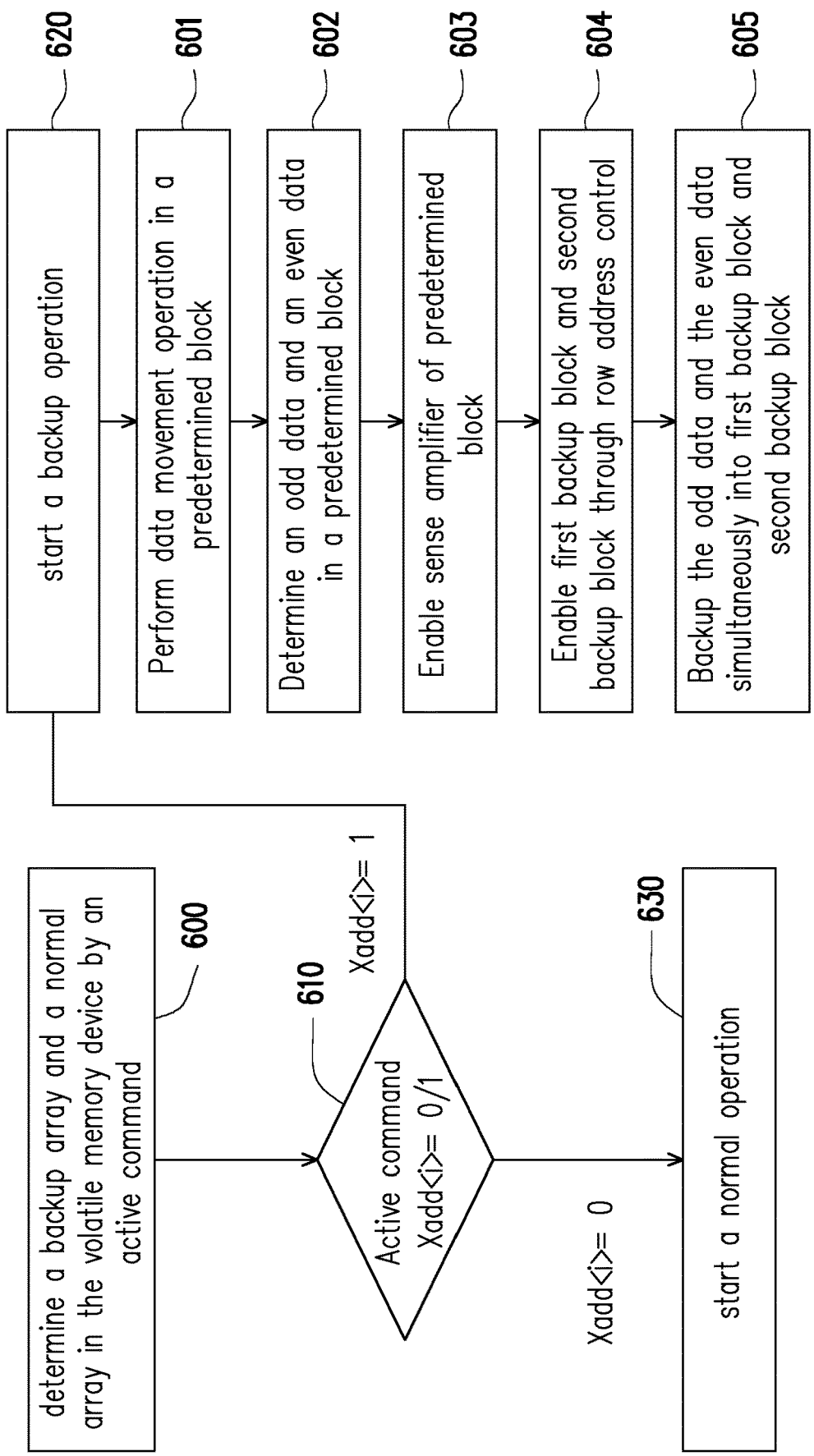
FIG. 6 illustrates a flow chart of data access operation in volatile memory device according to an exemplary embodiment of the disclosure.

FIG. 6 is a flow chart of data access operation in volatile memory device according to an exemplary embodiment of the disclosure which includes the steps of determining a backup array and a normal array in the volatile memory device by an active command in step S600. The active command is defined as Xadd<i>=0/1, determine the active command whether to perform normal operation or backup operation in the volatile memory device in step S610. When the active command is Xadd<i>=0, the volatile memory device is determined to perform normal operation as defined in step S630. When the active command during step S610 is determined to be Xadd<i>=1, the volatile memory device enable the start of backup operation as defined in step S620. The steps for performing backup operation includes the following steps: performing a data movement operation in a predetermined block in step S601. In step S602, determines an odd data and an even data in the predetermined block. In step S603, periodically enable the sense amplifier of the cells in the predetermined block. Subsequent to enable the sense amplifier, enable a first backup block and a second backup block in the dynamic memory array through a row address control in step S604. After performing all the steps discussed above, in step S605, this method backup the odd data and the even data simultaneously into the first backup block and the second backup block.

In summary, the embodiments of the invention introduce a volatile memory device and the method of efficient hidden data movement in a volatile memory device. This method may perform dedicated data movement in the volatile memory device. In addition to the data movement hidden backup is performed at the same time at different location by sub diving the data into odd data and even data into first data backup block and second data backup block. Thus, the wide data path is not needed to transfer the bulk data. Furthermore, by performing the hidden backup operation during the bulk data movement operation the power consumption is greatly reduced by sharing the backup operation with the refresh function. This method is not limited to the control signal from the controller to perform the data movement operations, also done by self-refresh or auto refresh operation. The volatile memory may also determine the first backup block and the second backup block without active command.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of efficient data movement in a volatile memory device having a dynamic memory array, comprising:
    determining a backup array and a normal array in the volatile memory device by an active command,
    wherein a normal operation and a backup operation is determined by the active command;
    the steps of performing the backup operation comprises:
        performing a data movement operation in a predetermined block;
        determining an odd data and an even data in the predetermined block;
        periodically enabling a sense amplifier of the predetermined block;
        subsequent to enabling sense amplifier, enabling a first backup block and a second backup block in the dynamic memory array through a row address control; and
        backup the odd data and the even data simultaneously into the first backup block and the second backup block,
        wherein the volatile memory device self-defines the first backup block and the second backup block in the dynamic memory array.

2. The method of claim 1, wherein a volatile memory device determines the first backup block and the second backup block in the dynamic memory array through an active command.

3. The method of claim 1, further performing the data movement operation in the predetermined block is determined by the active command.

4. The method of claim 1, further performing a data movement operation in the predetermined block is determined by a self-refresh operation.

5. The method of claim 2, wherein the active command comprises an address location of the predetermined block, the first backup block and the second backup block.

6. The method of claim 4, wherein during the self-refresh operation, determining the data movement operation with backup or without backup is selected by a model repository backup or a backup on-the-fly.

7. A volatile memory device, comprising:
    a plurality of subarray, configured to access data, wherein each of the subarray is electrically coupled to each other;
    a row control, configured to control the row of each of the plurality of subarray;
    a column control, configured to control the column of each of the plurality of subarray;
    a plurality of sense amplifier, adapted to each of the plurality of sub array is periodically enabled during the data access operation; and
    a plurality of sub word driver, adapted on the adjacent to the plurality of sub array provides a driving signal to the corresponding word line in the plurality of subarray,
    wherein the volatile memory device performs a data movement operation in a predetermined block and determine an odd data and an even data in the predetermined block,
    the volatile memory device enables a first backup block and a second backup block in a dynamic memory array through the row address control and backup the odd data and the even data simultaneously into the first backup block and the second backup block.

8. The device of claim 7, wherein the volatile memory device determines the first backup block and the second backup block in the dynamic memory array through an active command.

9. The device of claim 7, wherein the volatile memory device self-defines the first backup block and the second backup block in the dynamic memory array.

10. The device of claim 7, wherein the volatile memory device performs a data movement operation in the predetermined block is determined by the active command.

11. The device of claim 7, wherein the volatile memory device performs a data movement operation in the predetermined block is determined by a self-refresh operation.

12. The device of claim 8, wherein the active command comprises an address location of the predetermined block, the first backup block and the second backup block.

13. The device of claim 11, wherein during the self-refresh operation, determining the data movement operation with backup or without backup is selected by a model repository backup or a backup on-the-fly.

* * * * *